United States Patent
Ahn (10) Patent No.: US 8,921,921 B2
(45) Date of Patent: Dec. 30, 2014

(54) NONVOLATILE MEMORY DEVICE AND METHOD FOR FABRICATING THE SAME

(71) Applicant: SK Hynix Inc., Gyeonggi-do (KR)

(72) Inventor: Jung-Ryul Ahn, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 81 days.

(21) Appl. No.: 13/717,145

(22) Filed: Dec. 17, 2012

(65) Prior Publication Data
US 2014/0035023 A1 Feb. 6, 2014

(30) Foreign Application Priority Data

Aug. 2, 2012 (KR) ........................ 10-2012-0084753

(51) Int. Cl.
| | |
|---|---|
| *H01L 29/792* | (2006.01) |
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 21/336* | (2006.01) |
| *H01L 29/66* | (2006.01) |
| *H01L 27/115* | (2006.01) |

(52) U.S. Cl.
CPC ........ *H01L 29/792* (2013.01); *H01L 29/66666* (2013.01); *H01L 27/1157* (2013.01); *H01L 27/11582* (2013.01); *H01L 29/66833* (2013.01); *H01L 29/7926* (2013.01)
USPC .................. 257/324; 257/329; 257/E29.309; 438/268

(58) Field of Classification Search
CPC ........................ H01L 29/792; H01L 29/66666
USPC .................. 257/324, 329, E29.309; 438/268
See application file for complete search history.

(56) References Cited

U.S. PATENT DOCUMENTS

| | | | |
|---|---|---|---|
| 2013/0309849 A1* | 11/2013 | Jung et al. ..................... | 438/479 |
| 2014/0061770 A1* | 3/2014 | Lee et al. ....................... | 257/324 |
| 2014/0099761 A1* | 4/2014 | Kim et al. ...................... | 438/269 |

FOREIGN PATENT DOCUMENTS

| | | |
|---|---|---|
| KR | 1020080001284 | 1/2008 |
| KR | 1020100024096 | 3/2010 |

* cited by examiner

*Primary Examiner* — David S Blum
(74) *Attorney, Agent, or Firm* — IP & T Group LLP (57) ABSTRACT

A nonvolatile memory device includes a stacked structure disposed over a substrate and having a plurality of interlayer dielectric layers and conductive layers that are alternately stacked, a plurality of holes formed to pass through the stacked structure to expose the substrate, a first memory layer and a second memory layer formed separately in a circumference of each hole, and a first channel layer and a second channel layer formed respectively on the first and second memory layers.

15 Claims, 10 Drawing Sheets

NONVOLATILE MEMORY DEVICE AND METHOD FOR FABRICATING THE SAME

CROSS-REFERENCE TO RELATED APPLICATIONS

The present application claims priority of Korean Patent Application No. 10-2012-0084753, filed on Aug. 2, 2012, which is incorporated herein by reference in its entirety.

BACKGROUND

1. Field

Exemplary embodiments of the present invention relate to a nonvolatile memory device and a method for fabricating the same, and more particularly, to a nonvolatile memory device including a plurality of memory cells stacked substantially perpendicularly over a substrate and a method for fabricating the same.

2. Description of the Related Art

A nonvolatile memory device maintains data stored therein even though power supply is cut off. Currently, various nonvolatile memory devices such as a NAND flash memory device and the like are widely used.

Recently, as the improvement in integration degree of a 2D nonvolatile memory device including memory cells formed as a signal layer over a silicon substrate reaches the limit, a 3D nonvolatile memory device including a plurality of memory cells stacked substantially perpendicularly from a silicon substrate has been proposed. The 3D nonvolatile memory device will be briefly described below.

A conventional 3D nonvolatile memory device includes a plurality of interlayer dielectric layers and gate electrode layers that are alternately stacked over a substrate, a plurality of pillar-shaped channels connected to the substrate through the stacked structure, and a memory layer interposed between the channel and the gate electrode layer. The memory layer may store charges while insulating the channel and the gate electrode layer. In general, the memory layer has a triple-layer structure of a tunnel insulating layer, a charge storing layer, and a charge blocking layer.

In the above-described structure, a memory layer interposed between a gate electrode layer and a channel forms a unit memory cell. Therefore, when supposing that N gate electrode layers are stacked over the substrate and M channels are arranged to pass through the N gate electrodes, M×N memory cells may be formed.

In such a structure, the channel may be formed by the following process: a hole is formed through the stacked structure through a mask and etch process and a channel layer is buried in the hole.

However, there is a limitation in reducing the width of the hole due to an exposure limit during the mask and etch process for forming the hole. Therefore, considering a limited area of the semiconductor device, the number of holes and the number of channels formed in the respective holes are inevitably limited to a predetermined number or less. When the number of channels is limited, it means that the number of memory cells to be formed is limited. Accordingly, there is a limitation in increasing the integration degree of the memory device.

SUMMARY

Exemplary embodiments of the present invention are directed to a nonvolatile memory device and a method for fabricating the same, which is capable of increasing the integration degree of a device and securing the reliability of the device through a simple process.

In accordance with an embodiment of the present invention, a nonvolatile memory device includes a stacked structure disposed over a substrate and having a plurality of interlayer dielectric layers and conductive layers that are alternately stacked, a plurality of holes formed to pass through the stacked structure to expose the substrate, a first memory layer and a second memory layer formed separately in a circumference of each hole, and a first channel layer and a second channel layer formed respectively on the first and second memory layers.

In accordance with another embodiment of the present invention, a method for fabricating a nonvolatile memory device includes forming a stacked structure in which a plurality of interlayer dielectric layers and conductive layers are alternatively stacked over a substrate, forming a plurality of holes formed to pass through the stacked structure to expose the substrate, forming a memory layer in a circumference of each of the holes, forming a channel layer on the memory layer, and separating the memory layer and the channel layer into two or more parts in the hole by partially removing the memory layer and the channel layer.

In accordance with yet another embodiment of the present invention, a method for fabricating a nonvolatile memory device includes forming a stacked structure in which a plurality of interlayer dielectric layers and sacrifice layers are alternately stacked over a substrate, forming a plurality of holes formed to pass through the stacked structure to expose the substrate, forming a memory layer in a circumference of each of the holes, forming a channel layer on the memory layer, separating the memory layer and the channel layer into two or more parts inside the hole by partially removing the memory layer and the channel layer, removing the sacrifice layers, and forming a plurality of conductive layers by burying a conductive material in spaces formed by removing the sacrifice layers.

BRIEF DESCRIPTION OF THE DRAWINGS

FIGS. 1A to 5B are diagrams illustrating a nonvolatile memory device and a method for fabricating the same in accordance with an embodiment of the present invention.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something).

Figure 3A:
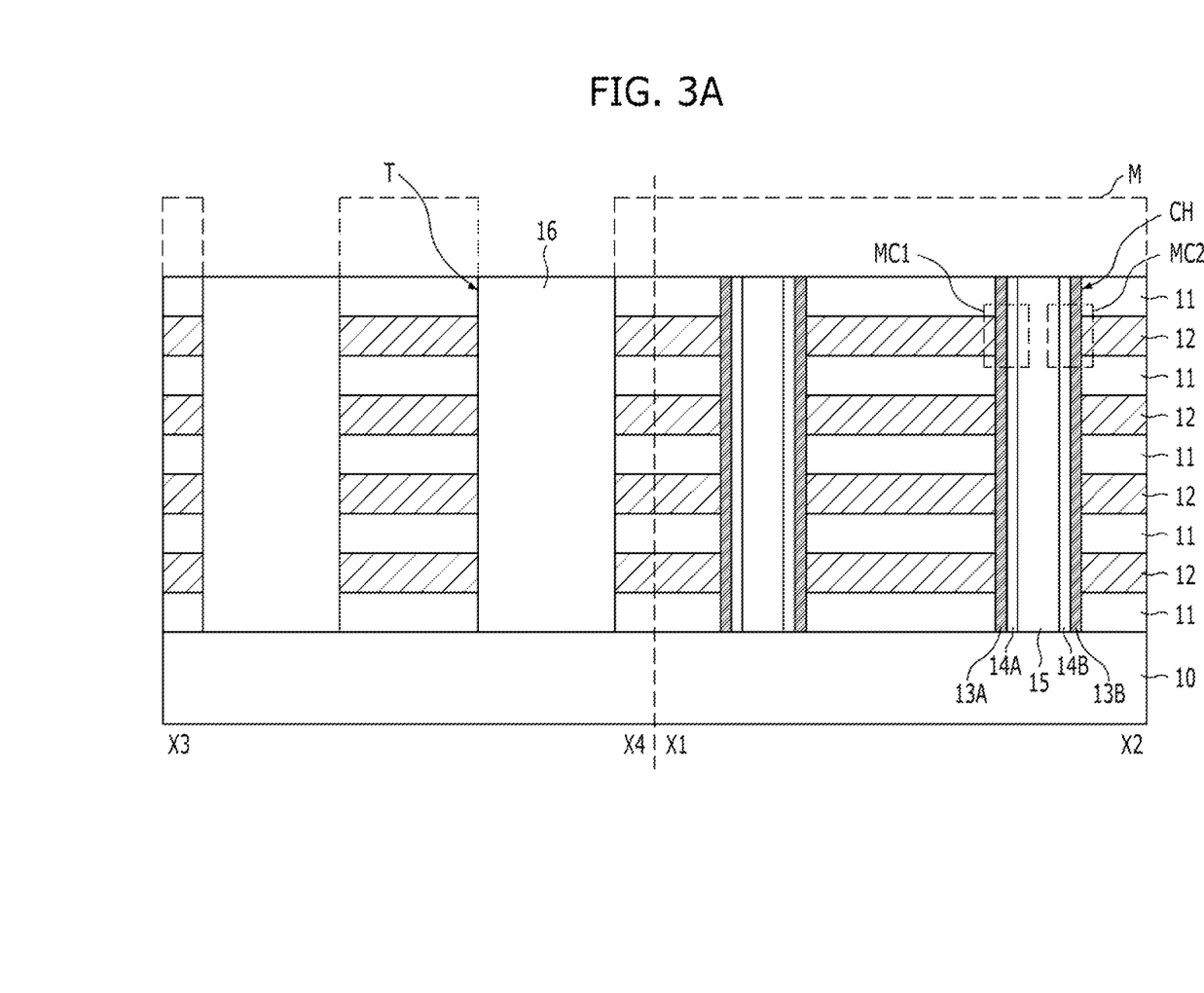
Figure 3B:
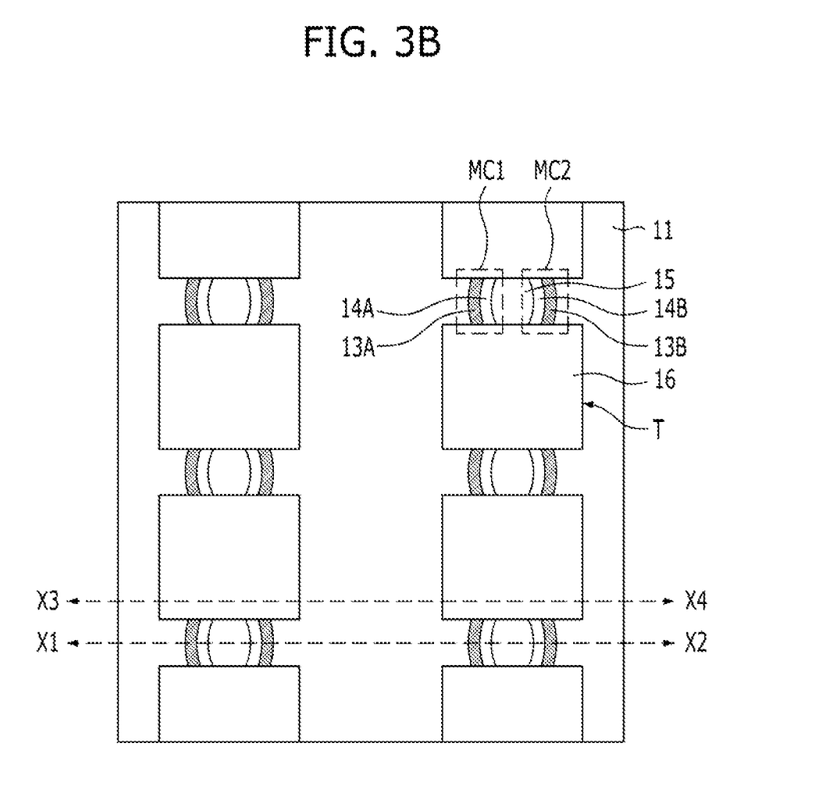
Figure 4A:
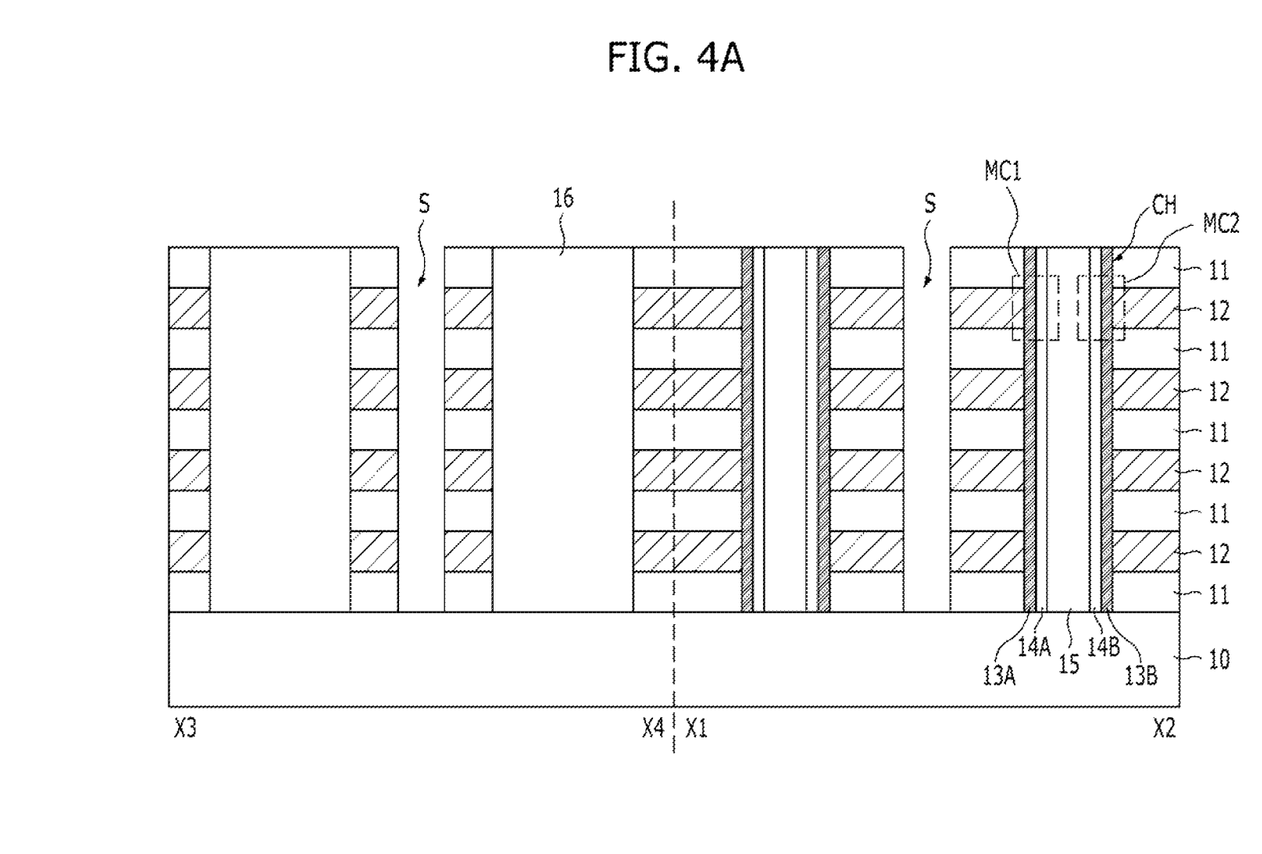
Figure 4B:
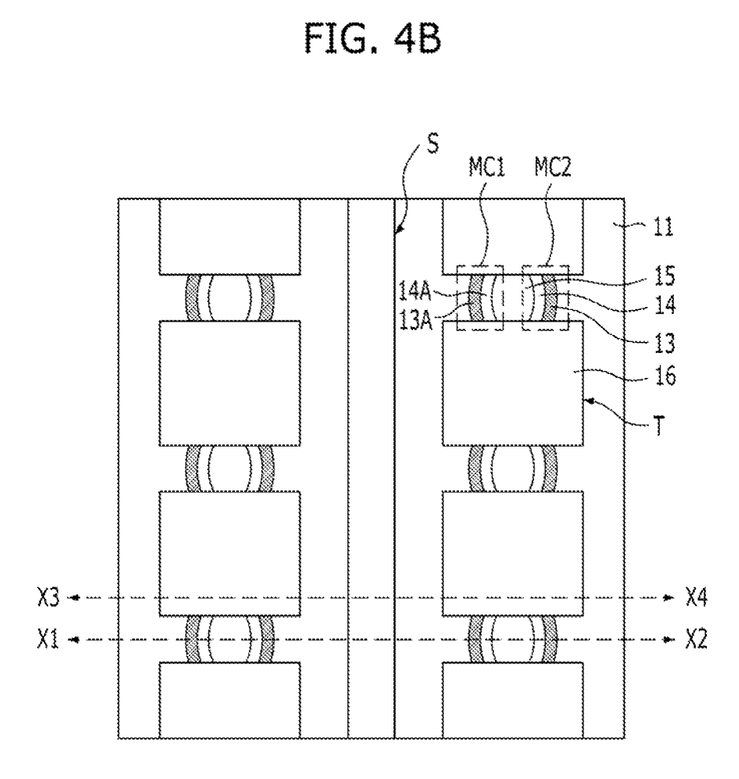
Figure 5A:
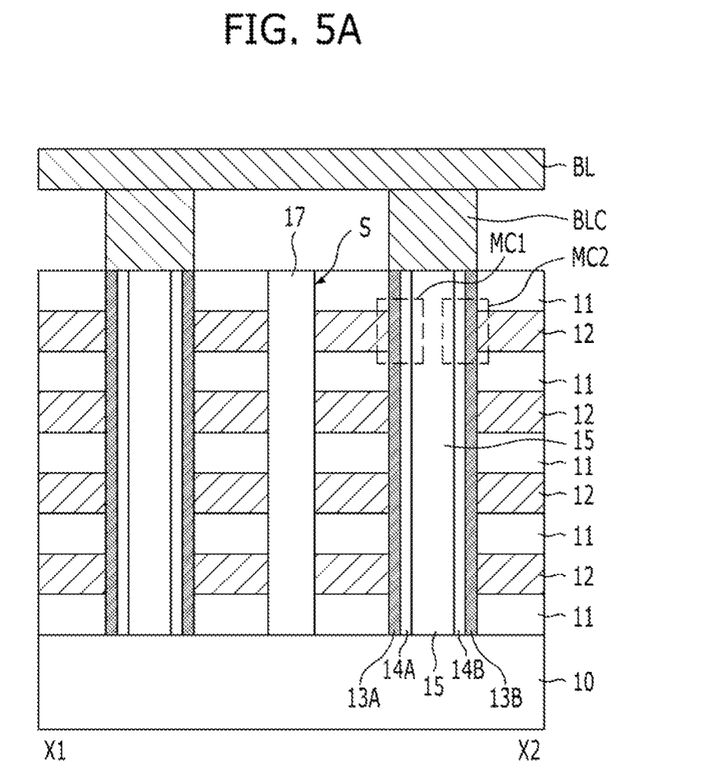
Figure 5B:
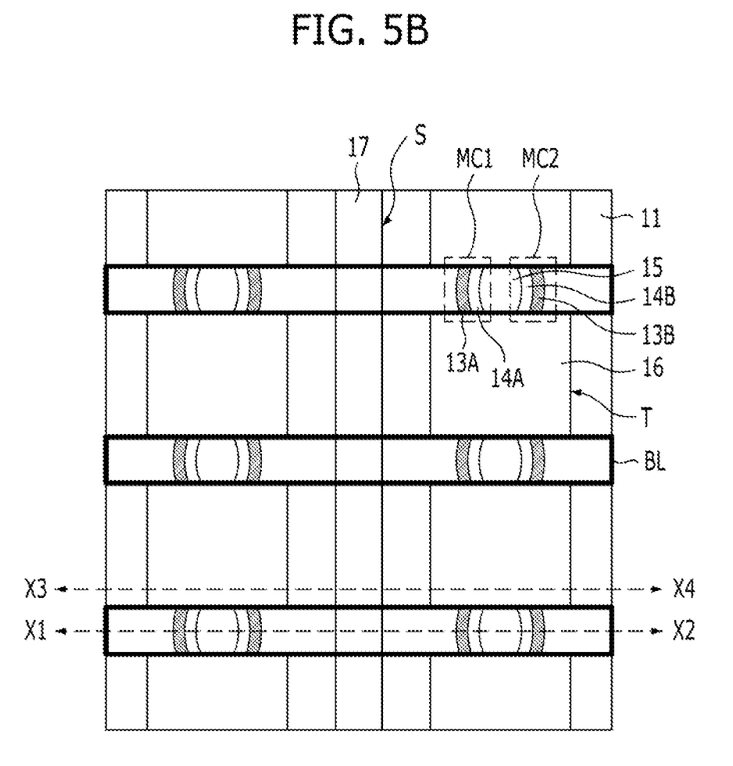

FIGS. 1A to 5B are diagrams illustrating a nonvolatile memory device and a method for fabricating the same in accordance with an embodiment of the present invention. In particular, FIGS. 5A and 5B illustrate the nonvolatile memory device, and FIGS. 1A to 4B illustrate intermediate steps for fabricating the nonvolatile memory device of FIGS. 5A and 5B. FIGS. 1B, 2B, 3B, 4B, and 5B are plan views, and FIGS. 1A, 2A, 3A, 4A, and 5A are cross-sectional views taken along line X1-X2 and/or line X3-X4 of FIGS. 1B, 2B, 3B, 4B, and 5B, respectively.

First, the method for fabricating a nonvolatile memory device will be described.

Figure 1A:
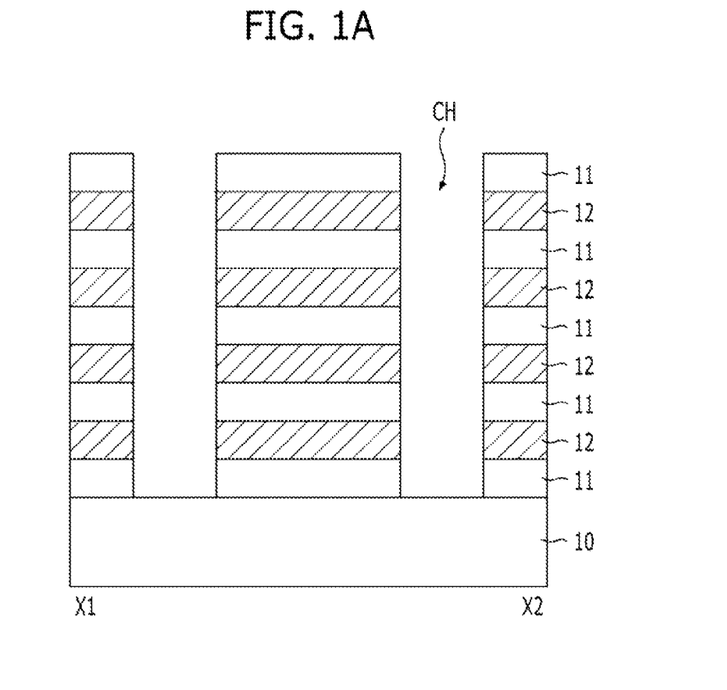
Figure 1B:
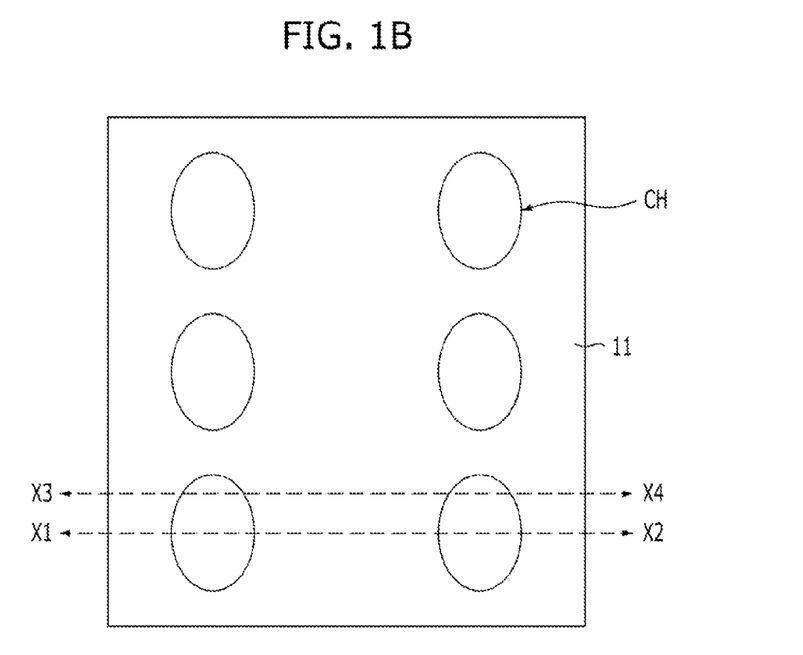

Referring to FIGS. 1A and 1B, a structure in which a plurality of interlayer dielectric layers 11 and conductive layers 12 are alternately stacked (hereinafter, referred to as a stacked structure) is formed over a substrate having a predetermined lower structure, for example, a source region (not illustrated). The conductive layers 12 may be used to form gate electrodes of memory cells. However, a part of the conductive layers 12, for example, the uppermost or lowermost conductive layer 12 may be used to form a gate electrode of a select transistor. The interlayer dielectric layers 11 serve to isolate the conductive layers 12 arranged at different layers. The interlayer dielectric layer 11 may be formed of oxide, and the conductive layer 12 may be formed of impurity-doped polysilicon, for example.

The stacked structure of the interlayer dielectric layers 11 and the conductive layers 12 are selectively etched to form a plurality of channel holes CH exposing the substrate 10 through the stacked structure. The plurality of channel holes CH may be arranged in a matrix shape along a second direction and a first direction crossing the second direction. The second direction corresponds to an extension direction of line X1-X2 or line X3-X4. The number of channel holes CH arranged in the first and second directions may be changed in various manners. In this embodiment of the present invention, the channel hole CH may have an elliptical shape of which the diameter in one direction, for example, the first direction is larger than the diameter in another direction, for example, the second direction.

Figure 2A:
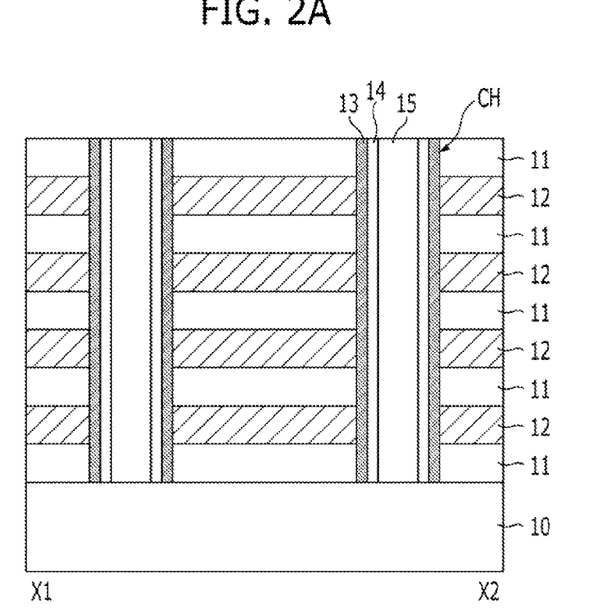
Figure 2B:
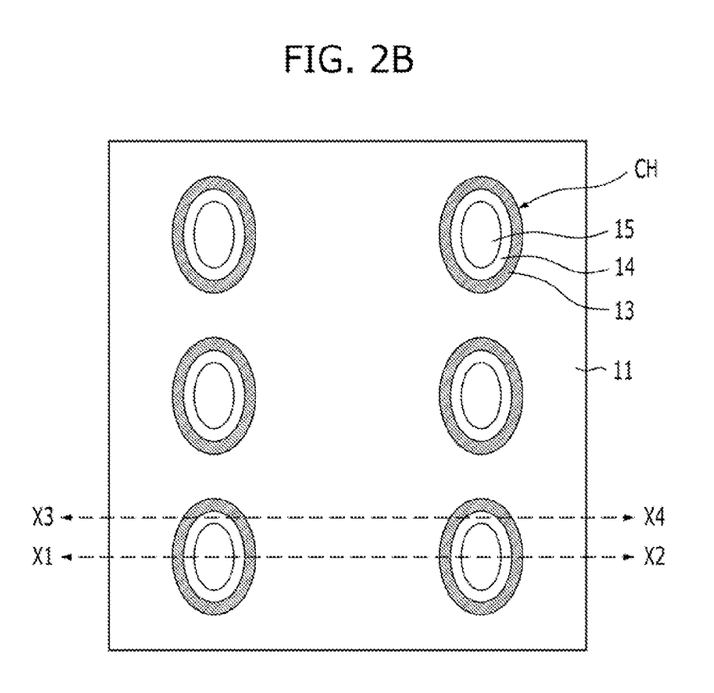

Referring to FIGS. 2A and 2B, a memory layer 13 is formed on the entire sidewall of the channel hole CH. The memory layer 13 may be formed by the following process: a material layer for forming the memory layer 13 is deposited along the entire surface of the resulting structure having the channel hole CH formed therein, and then etched through a blanket etch process. The memory layer 13 may include a charge blocking layer, a charge storing layer, and a tunnel insulating layer, which are sequentially formed from a side close to the conductive layers 12. For example, the memory layer 13 may include an oxide-nitride-oxide (ONO) layer.

Then, a channel layer 14 is formed on the entire sidewall of the memory layer 13. The channel layer 14 may be formed by the following process: a material layer for forming the channel layer 14 is deposited along the entire surface of the resulting structure having the memory layer 13 formed therein, and then etched through a blank etch process. The channel layer 14 may include a semiconductor material such as polysilicon. Furthermore, the channel layer 14 is formed to such a thickness as not to completely fill the channel hole CH. Accordingly, an empty space exists in the center of the channel hole CH.

The empty space existing in the center of the channel hole CH is filled with a first insulating material 15. The first insulating material 15 may include oxide, for example.

Referring to FIGS. 3A and 3B, the memory layer 13 and the channel layer 14 are partially removed and separated into at least two parts in one channel hole CH. In this embodiment of the present invention, both edge portions of the memory layer 13 and the channel layer 14 in one channel hole CH, based on the first direction, are removed. As a result, a first memory layer 13A and a first channel layer 14A that exist at one side in the second direction, for example, the left side, and a second memory layer 13B and a second channel layer 14B that exist at the other side in the second direction, for example, the right side, may exist in one channel hole CH. The first and second memory layers 13A and 13B are isolated from each other, and the first and second channel layers 14A and 14B are also isolated from each other. Furthermore, the first and second memory layers 13A and 13B may face each other, and the first and second channel layers 14A and 14B may also face each other.

The first and second memory layers 13A and 13B and the first and second channel layers 14A and 14B may be formed by the following process. Specifically, a mask pattern having openings corresponding to trenches T and covering the other area of the resulting structure of FIGS. 2A and 2B is formed over the resulting structure. The openings may expose both edge portions of the memory layer 13 and the channel layer 14, based on the first direction, in one channel hole CH. Furthermore, one opening may expose the memory layers 13 and the channel layers 14 disposed at one edge and the other edge of adjacent two channel holes CH, respectively, in the first direction. In this case, since the width of the opening is increased, the mask pattern M may be easily formed. Furthermore, when the diameter of the channel hole CH in the first direction is relatively large as described above, a distance between openings in the first direction may be sufficiently secured, that is, the width of a portion where the memory layer 13 and the channel layer 14 are to remain may be secured. Using the mask pattern M as an etch barrier, the stacked structure is etched to form trenches T corresponding to the openings. Then, the trenches T are filled with a second insulating material 16. The second insulating material 16 may include oxide, for example.

As such, when the memory layer 13 and the channel layer 14 are partially removed to form the first and second memory layers 13A and 13B and the first and second channel layers 14A and 14B, which are isolated from each other in one channel hole CH, the integration degree of the nonvolatile memory device in the same area may substantially increase compared to the conventional nonvolatile memory device. This will be described below in more detail.

Furthermore, when the mask pattern M is used to partially remove the memory layer 13 and the channel layer 14, the formation process of the mask pattern M, the formation process of the trench T, and the burying process of the second insulating material 16 may be easily performed, because the openings have a sufficiently large size.

In this embodiment of the present invention, the memory layer 13 and the channel layer 14 in one channel hole CH are separated into two parts, but the present invention is not limited thereto. In another embodiment, the shape of the mask pattern M may be modified in various manners to separate one memory layer 13 and one channel layer 14 into three or more parts.

Referring to FIGS. 4A and 4B, the stacked structure is selectively etched to form slits S.

The slit S serves to separate the conductive layer 12 into word lines extended in the first direction. The slit S may be disposed between the adjacent channel holes CH and extended in the first direction. In this embodiment of the present invention, the slit S is formed to such a thickness to expose the substrate 10, but the present invention is not limited thereto. The slit S may have a depth to pass through at least the lowermost conductive layer 12.

Referring to FIGS. 5A and 5B, the slit S is filled with a third insulating material 17, for example, oxide, and well-known subsequent processes such as a bit line contact and bit line formation process are performed. The bit line contact BLC may be formed to overlap one channel CH, and the bit line BL may be extended in the second direction crossing the extension direction of word lines and connected to the first memory layer 13A and the second memory layer 13B and the first channel layer 14A and the second channel layer 14B in the channel holes CH arranged in the second direction through the bit line contact BLC.

Through the above-described fabrication method, the nonvolatile memory device illustrated in FIGS. 5A and 5B may be fabricated.

Referring to FIGS. 5A and 5B, the first and second memory layers 13A and 13B are formed on the sidewalls of one channel hole CH to be separated from each other, and the first and second channel layers 14A and 14B are formed on the sidewalls of the first and second memory layers 13A and 13B, respectively, to be separated from each other.

Therefore, in this embodiment of the present invention, the channel layer 14A and the first memory layer 13A in one conductive layer 12 and one channel hole CH form one unit memory cell MC1, and the second channel layer 14B and the second memory layer 13B in the same conductive layer 12 and the same channel hole CH form another unit memory cell MC2. In the conventional nonvolatile memory device, when N conductive layers and M channel holes exist, one memory layer and one channel layer are disposed in each channel hole. Therefore, N×M memory cells are formed. In this embodiment of the present invention, however, when assuming that N conductive layers and M channel holes exist, two memory layers 13A and 13B and two channel layers 14A and 14B are disposed in each channel hole. Therefore, N×2M memory cells are formed. That is, the integration degree may be doubled.

Furthermore, in this embodiment of the present invention, since the channel layer 14 as well as the memory layer 13 is separated, the operation characteristic of the nonvolatile memory device may improve. When the memory layer 13 is separated and the channel layer 14 is not separated, the nonvolatile memory device may not normally operate depending on the charge storage state of the charge storing layer of the memory layer 13. For example, the memory layer 13 may be separated into the first and second memory layers 13A and 13B, but the channel layer 14 may not be separated. In this state, when assuming that the first memory layer 13A contacted with one conductive layer 12 is filled with electrons and the second memory layer 13B is not filled with electrons, the resistance of a contact portion between the channel layer 14 and the first memory layer 13A is relatively high, but the resistance of a contact portion between the channel layer 14 and the second memory layer 13B is relatively low. Therefore, when the first memory layer 13A is filled with electrons, a current may flow through the contact portion between the second memory layer 13B and the channel layer 14, even though a current must not flow through the channel layer 14. In this case, the nonvolatile memory device may not normally operate. For example, the nonvolatile memory device may not be able to control on/off of memory cells. Therefore, in this embodiment of the present invention, the memory layer 13 and the channel layer 14 may be partially removed to improve the operation characteristic of the nonvolatile memory device.

Furthermore, as described above, the memory layer and the channel layer inside one channel hole CH may be separated into three or more parts. In this case, the memory layer and the channel layer in one conductive layer 12 and one channel hole CH may form three or more unit memory cells.

Meanwhile, the nonvolatile memory device of FIGS. 5A and 5B may be fabricated through various methods other than the above-described method. For example, the nonvolatile memory device may be fabricated through a method described with reference to FIGS. 6 and 7.

Figure 6:
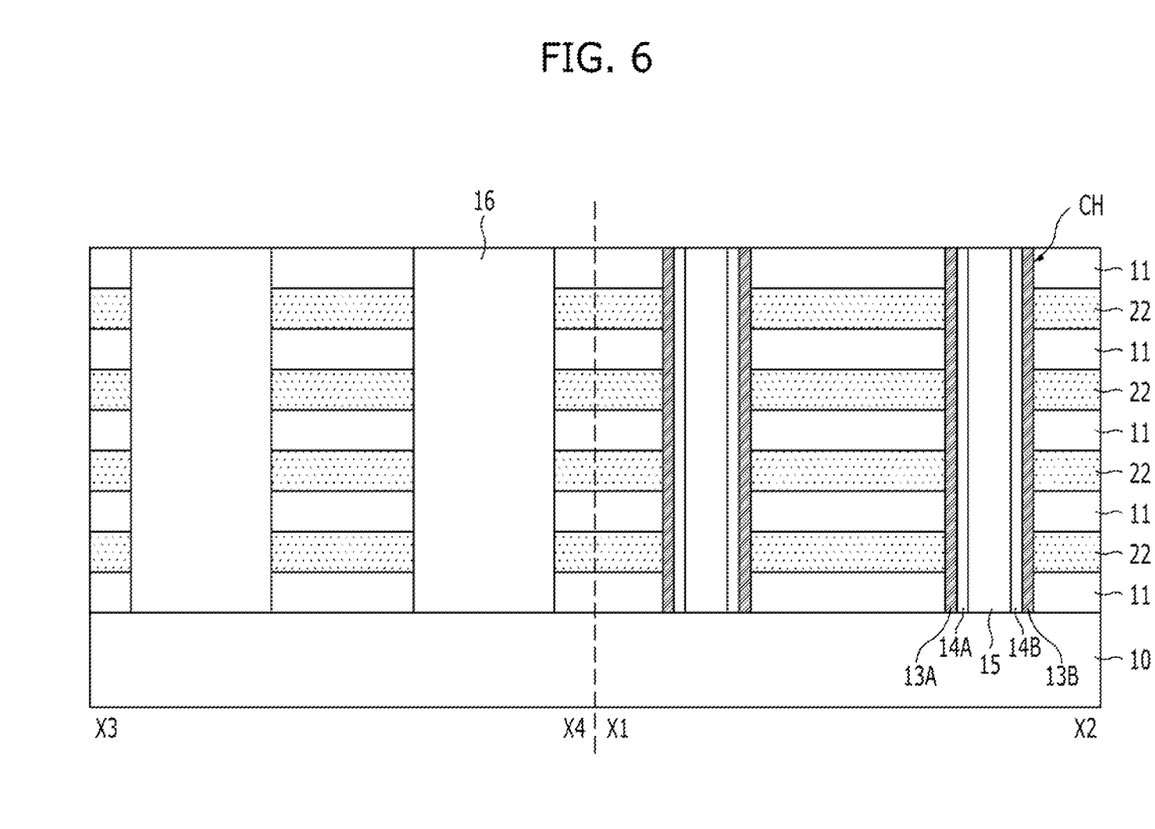
FIGS. 6 and 7 are diagrams illustrating a method for fabricating a nonvolatile memory device in accordance with another embodiment of the present invention.
Figure 7:
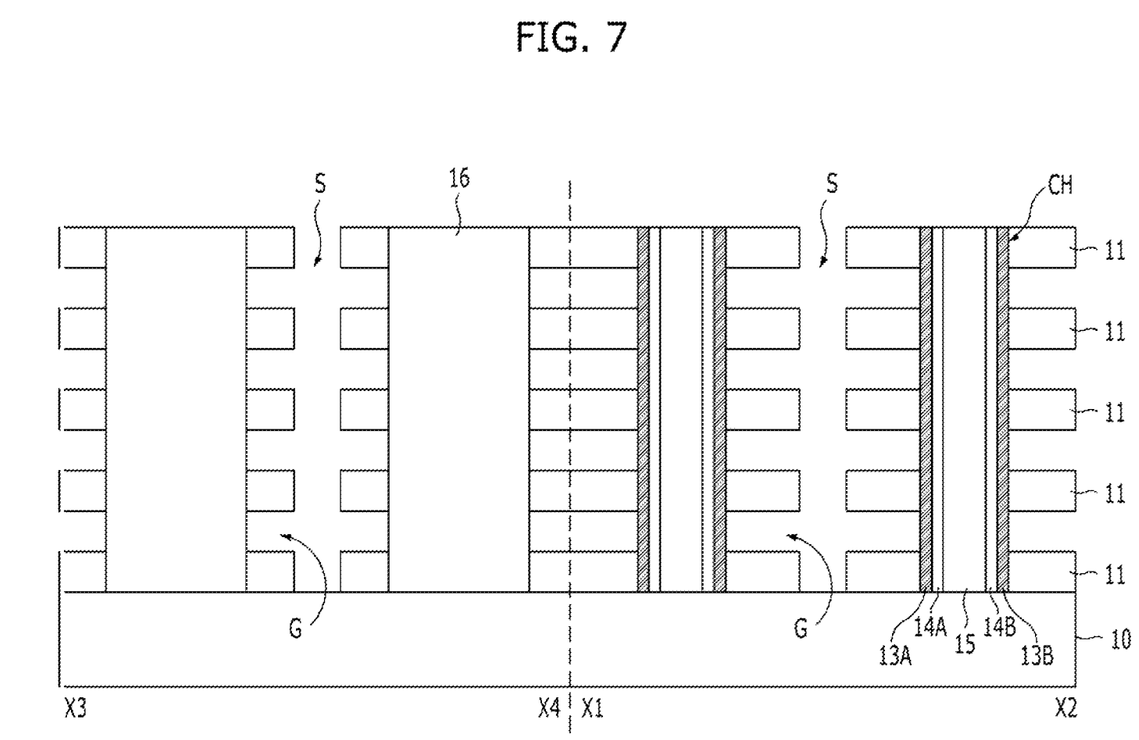

FIGS. 6 and 7 are diagrams illustrating a method for fabricating a nonvolatile memory device in accordance with another embodiment of the present invention.

Referring to FIG. 6, the processes of FIGS. 1A to 3B are performed in substantially the same manner, except that sacrifice layers 22 are stacked instead of the conductive layers 12 during the process of FIG. 1A.

Referring to FIG. 7, the stacked structure of the interlayer dielectric layers 11 and the sacrifice layers 22 of FIG. 6 is selectively etched to form a slit S. The slit S is formed to remove the sacrifice layers 22, and may have a depth to pass through at least the lowermost sacrifice layer 22. Furthermore, the slit S may be disposed between the adjacent channel holes CH in the second direction and extended in the first direction such that a conductive layer 12 to be formed through a subsequent process is separated into word lines extended in the first direction.

Then, the sacrifice layers 22 exposed by the slit S are removed. In FIG. 7 spaces formed by removing the sacrifice layers 22 are represented by G.

When the spaces formed by removing the sacrifice layers 22 are filled with a conductive material the resulting structure illustrated in FIGS. 4A and 4B may be formed. A subsequent process may be performed in substantially the same manner as described with reference to FIGS. 5A and 5B.

In this embodiment of the present invention, since the sacrifice layer 22 is used, a metal or metal nitride that is difficult to etch may be used as the conductive layer 12. Furthermore, during the removal process of the sacrifice layers 22, the second insulating material 15 as well as the structures 13, 14, and 15 in the channel hole CH may serve as a supporting structure.

In accordance with the embodiment of the present invention, the integration degree of the nonvolatile memory device may increase and improve, and the reliability of the nonvolatile memory device through a simple process may be secured.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:
   a stacked structure disposed over a substrate and having a plurality of interlayer dielectric layers and conductive layers that are alternately stacked;
   a plurality of holes formed to pass through the stacked structure to expose the substrate;
   a first memory layer and a second memory layer formed separately in a circumference of each hole; and
   first and second channel layers formed respectively over the first and second memory layers.

2. The nonvolatile memory device of claim 1, wherein the first memory layer and the second memory layer face each other, and
the first channel layer and second channel layer face each other.

3. The nonvolatile memory device of claim 1, wherein each of the first memory layer and second memory layer comprises a charge blocking layer, a charge storing layer, and a tunnel insulating layer, which are sequentially arranged from a side close to the conductive layer.

4. The nonvolatile memory device of claim 1, further comprising:
a plurality of trenches formed through the stacked structure; and
an insulating material buried in each of the trenches,
wherein each of the trenches overlaps one edge of one hole and the other edge of another hole adjacent to the one hole, in a first direction, and
the first memory layer and second memory layer and the first channel layer and second channel layer are disposed in a circumference of the hole, which are not overlapped with the trench.

5. The nonvolatile memory device of claim 4, wherein the hole has an elliptical shape of which the diameter in the first direction is larger than the diameter in a second direction crossing the first direction.

6. A method for fabricating a nonvolatile memory device, comprising:
forming a stacked structure in which a plurality of inter-layer dielectric layers and conductive layers are alternatively stacked over a substrate;
forming a plurality of holes formed to pass through the stacked structure to expose the substrate;
forming a memory layer in a circumference of each of the holes;
forming a channel layer on the memory layer; and
separating the memory layer and the channel layer into two or more parts in the hole by partially removing the memory layer and the channel layer.

7. The nonvolatile memory device of claim 6, wherein the separating the memory layer and the channel layer comprises:
forming a mask pattern having a plurality of openings to expose the memory layer and the channel layer in a first direction; and
etching the memory layer and the channel layer exposed through the openings, using the mask pattern as an etch mask.

8. The nonvolatile memory device of claim 7, wherein each of the openings simultaneously exposes the memory layer and the channel layer at one edge of one hole and the memory layer and the channel layer at the other edge of another hole adjacent to the one hole, in the first direction.

9. The nonvolatile memory device of claim 7, wherein the hole has an elliptical shape of which the diameter in the first direction is larger than the diameter in a second direction crossing the first direction.

10. The nonvolatile memory device of claim 7, further comprising burying an insulating material in the etched region, after etching the memory layer and the channel layer.

11. A method for fabricating a nonvolatile memory device, comprising:
forming a stacked structure in which a plurality of inter-layer dielectric layers and sacrifice layers are alternately stacked over a substrate;
forming a plurality of holes formed to pass through the stacked structure to expose the substrate;
forming a memory layer in a circumference of each of the holes;
forming a channel layer on the memory layer;
separating the memory layer and the channel layer into two or more parts in the hole by partially removing the memory layer and the channel layer;
removing the sacrifice layers; and
forming a plurality of conductive layers by burying a conductive material in spaces formed by removing the sacrifice layers.

12. The nonvolatile memory device of claim 11, wherein separating the memory layer and the channel layer comprises:
forming a mask pattern having a plurality of openings to expose the memory layer and the channel layer in a first direction; and
etching the memory layer and the channel layer exposed through the openings, using the mask pattern as an etch mask.

13. The nonvolatile memory device of claim 12, wherein each of the openings simultaneously exposes the memory layer and the channel layer at one edge of one hole and the memory layer and the channel layer at the other edge of another hole adjacent to the one edge, in the first direction.

14. The nonvolatile memory device of claim 12, wherein the hole has an elliptical shape of which the diameter in the first direction is larger than the diameter in a second direction crossing the first direction.

15. The nonvolatile memory device of claim 12, further comprising burying an insulating material in the etched region, after etching the memory layer and the channel layer.

* * * * *